United States Patent
Yamuro

[19]

[11] Patent Number: 5,931,570
[45] Date of Patent: Aug. 3, 1999

[54] LIGHT EMITTING DIODE LAMP

[75] Inventor: Yukio Yamuro, Tokyo, Japan

[73] Assignee: Hiyoshi Electric Co., Ltd., Tokyo, Japan

[21] Appl. No.: 08/857,441

[22] Filed: May 16, 1997

[30] Foreign Application Priority Data

May 20, 1996 [JP] Japan ................................. 8-124814
Aug. 2, 1996 [JP] Japan ................................. 8-204574

[51] Int. Cl.⁶ ............................................. F21V 3/04
[52] U.S. Cl. ........................... 362/355; 362/310; 362/311; 362/800; 313/512; 313/116
[58] Field of Search .................... 313/500, 511, 313/512, 116; 362/244, 246, 249, 310, 311, 800, 255, 355; 359/615

[56] References Cited

U.S. PATENT DOCUMENTS

| | | | |
|---|---|---|---|
| 1,574,607 | 2/1926 | Corcoran | 362/355 |
| 1,874,086 | 8/1932 | Dickson | 362/355 |
| 3,067,352 | 12/1962 | Vodicka et al. | 362/355 |
| 3,786,499 | 1/1974 | Jankowski et al. | 313/500 |
| 4,047,075 | 9/1977 | Schoberl | 313/500 |
| 4,143,394 | 3/1979 | Schoberl | 313/512 |
| 4,168,102 | 9/1979 | Chida et al. | 313/512 |
| 4,521,835 | 6/1985 | Meggs et al. | 362/470 |
| 4,733,335 | 3/1988 | Serizawa et al. | 362/503 |
| 4,843,280 | 6/1989 | Lumbard et al. | 313/500 |
| 5,018,053 | 5/1991 | Belknap et al. | 362/800 |
| 5,130,897 | 7/1992 | Kuzma | 362/24 |
| 5,140,220 | 8/1992 | Hasegawa | 313/512 |
| 5,155,669 | 10/1992 | Yamuro | 362/252 |
| 5,193,895 | 3/1993 | Naruke et al. | 362/542 |
| 5,253,149 | 10/1993 | Ostema et al. | 362/800 |
| 5,436,809 | 7/1995 | Brassier et al. | 362/545 |
| 5,567,037 | 10/1996 | Ferber | 362/249 |

FOREIGN PATENT DOCUMENTS

08036368  2/1996  Japan .

*Primary Examiner*—Alan Cariaso
*Attorney, Agent, or Firm*—Elman & Associates

[57] ABSTRACT

An LED lamp according to the present invention emits light approximately in all directions like a small filament lamp. The LED lamp is a light emitting bulb-shaped unit, and comprises an epoxy resin bulb-shaped portion; two leads of which one end is extended outside the bulb-shaped portion and the other end is embedded in the bulb-shaped portion; and an LED chip connected to the ends of the two leads and embedded in the bulb-shaped portion. The surface of the bulb-shaped portion of the LED lamp is formed in an appropriate process to be a frosted glass surface, a cut-diamond surface, a surface covered with small particles, or an optically-diffusing cap. Thus, a durable, non-fragile, and small power-consuming LED lamp can be obtained.

1 Claim, 13 Drawing Sheets

PRIOR ART

FIG. 2A  FIG. 2B  FIG. 2C  FIG. 2D  FIG. 2E

STANDARD DIRECTIONAL CHARACTERISTIC OF LED ELEMENT

PRIOR ART

FIG. 13B

LIGHT EMITTING DIODE LAMP

BACKGROUND OF THE INVENTION

1. Field of the Invention

The present invention relates to an LED lamp for emitting an approximately equal amount of light in all directions except backward from the base of the LED lamp.

2. Description of the Related Art

Conventionally, there have been devices for displaying characters and symbols to give information to people at a distance using small light emitting bulbs. These devices can be, for example, a news board of a limited size on which a stream of characters inform passengers of various news items. Around 1930, small filament lamps were put into practical use for these news boards. With the improvements in the technology for the display control of such display devices, the small filament lamps have come to be used for a large-size monochrome animation screen for outdoor use. However, most of the present large-size outdoor screens have display elements of cold-cathode tubes.

Since the small filament lamps can emit light forward, sideward, and obliquely backward, that is, in all directions except backward from the base of the bulb where electrodes are mounted, they are used, for example, as the illuminations on Christmas trees, which can be seen from every direction.

Figure 1A:
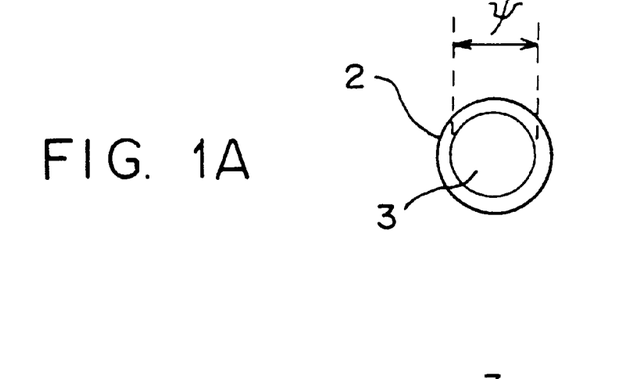
FIGS. 1A, 1B, and 1C are a top view, a side sectional view, and a bottom view respectively of a conventional LED lamp.
Figure 1B:
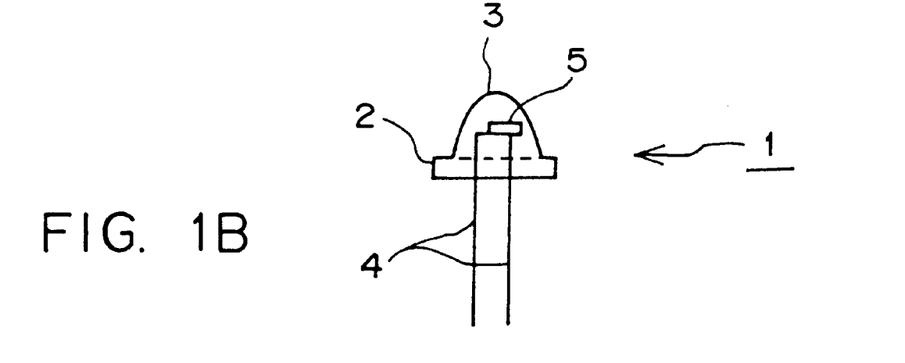
Figure 1C:
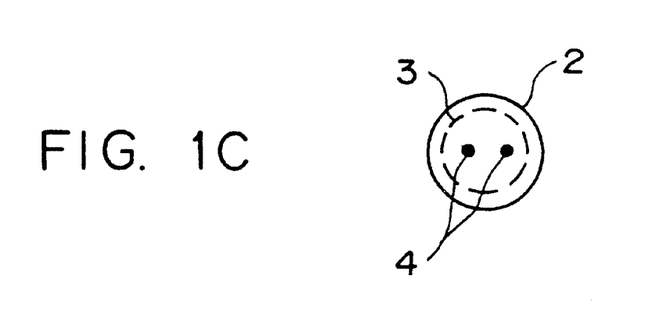

Recently, in addition to the above described small filament lamps, LED lamps are used as light emitting elements with an LED element embedded in a transparent resin or glass bulb-shaped portion as shown in FIG. 1. FIGS. 1A, 1B, and 1C are a front view, a side sectional view, and a bottom view respectively of the LED lamp. As shown in FIGS. 1A through 1C, the LED lamp comprises an epoxy resin bulb-shaped portion 3 formed with a flange 2 incorporated into its base; two leads 4, one end of each is extended outside the bulb-shaped portion 3 and the other end is embedded in the bulb-shaped portion 3; and an LED chip 5 embedded in the bulb-shaped portion 3 and connected to the ends 3 of the two leads 4.

One LED element is provided for the LED chip 5. If the luminous energy of the LED lamp should be increased, the number of the LED chips 5 embedded in the bulb-shaped portion 3 is increased corresponding to the desired luminous energy. Increasing the luminous energy to a certain extent can also be realized by increasing the bias voltage applied to the LED element. Generally, the diameter $\phi$ of the bulb-shaped portion 3 of the LED lamp is approximately 3 mm through 5 mm, and 10 mm at maximum.

Figure 2A:
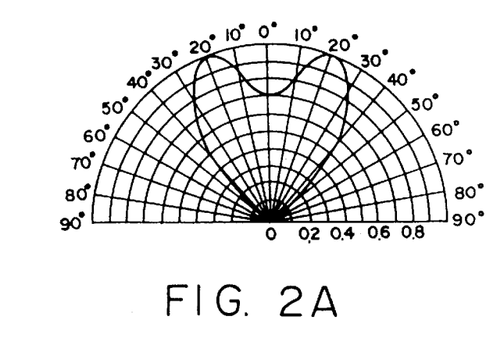
FIGS. 2A through 2E show that the conventional LED element is very directional in emission.
Figure 2B:
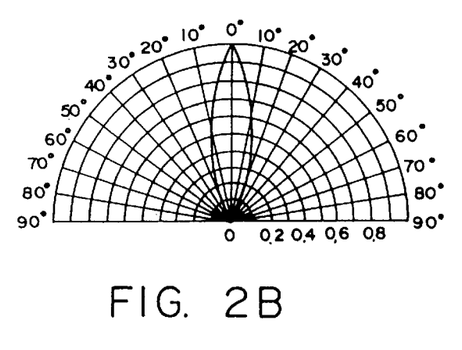
Figures 2C, 2D:
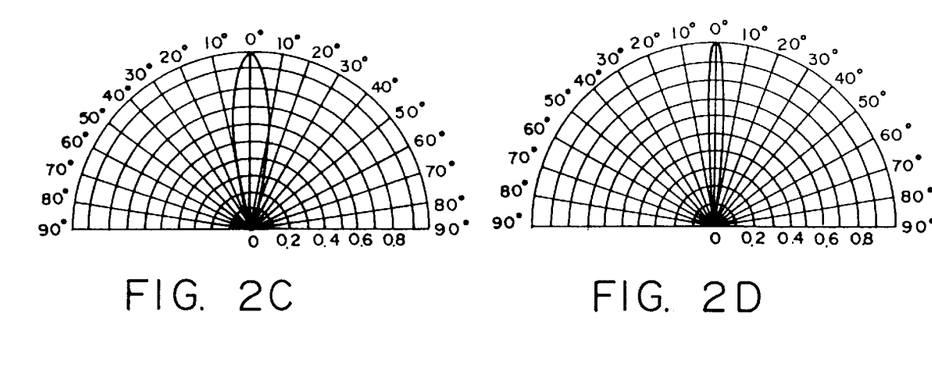
Figure 2E:
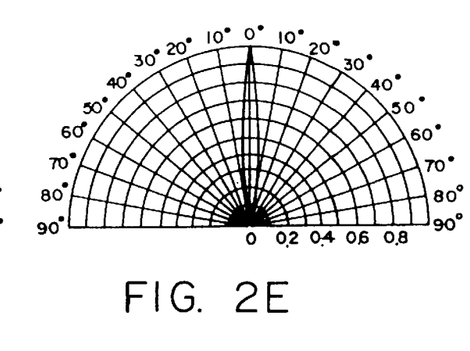

Normally, the light emitted from the LED element is very directional. For example, FIGS. 2A through 2E show the standard directional characteristics of the light emitted from an LED element at various emission angles. As shown in FIG. 2E, the emission angle is 10° or smaller in the forward direction. On the other hand, as shown in FIG. 2A, the emission angle is 80° or smaller in the forward direction.

Therefore, the LED lamp is not suitable for applications where light should be emitted in all directions like illuminations on a Christmas tree. Normally, the LED lamp is used for a display screen of a device on which information can be read from the front, such as a time table board at a station, a flight information board at an airport, etc.

Figure 3A:
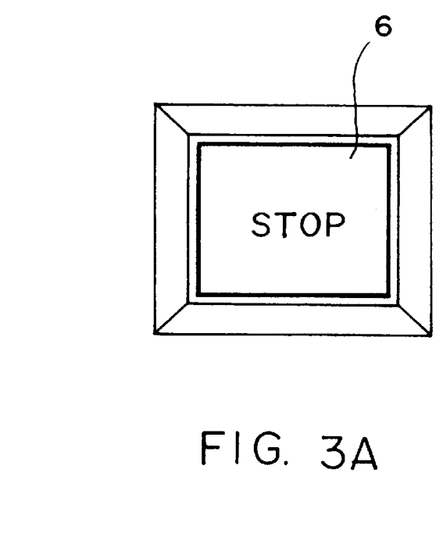
FIGS. 3A through 3C show that a single conventional LED lamp has insufficient luminous energy.

Recently, a push button (or a touch button) 6 as shown in FIG. 3A is adopted as a stop button in an elevator hall, a control button in an elevator, etc. The above described LED lamps are also used for such push buttons because of their durability and energy-saving properties.

Figure 3B:
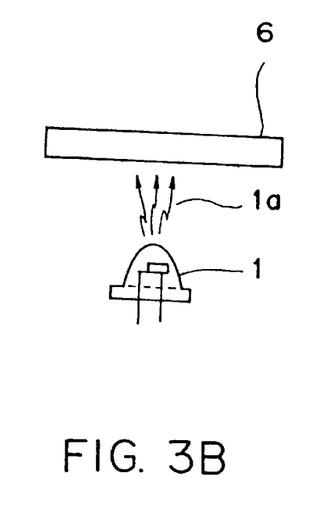
Figure 3C:
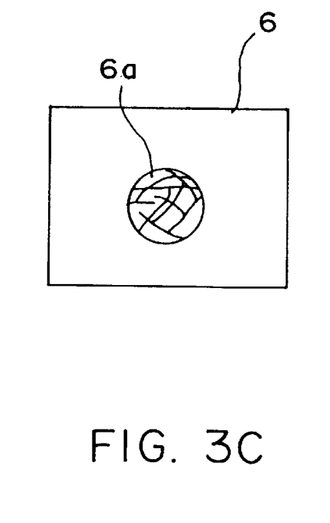
Figure 4:
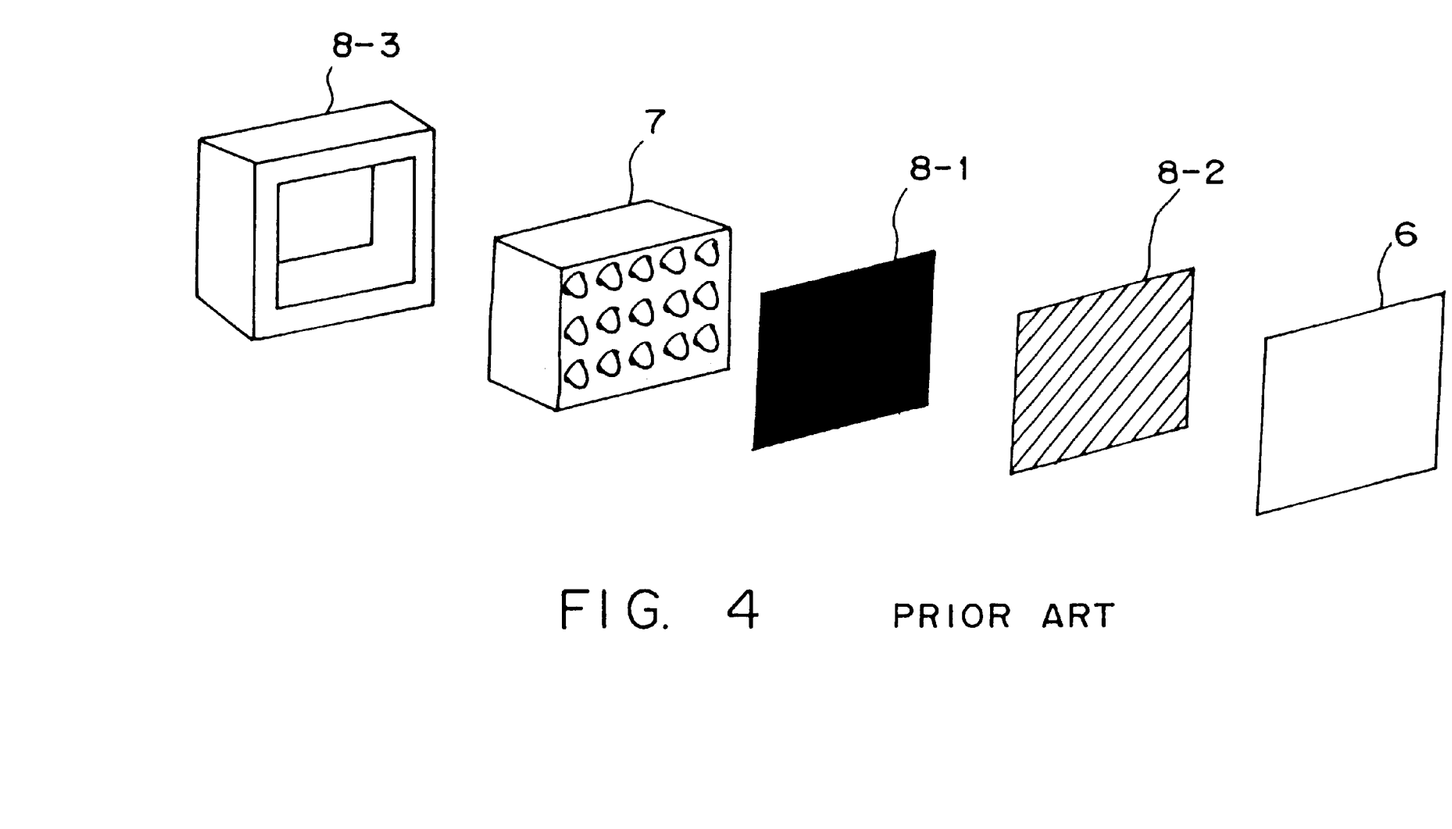
FIG. 4 shows the arrangement of the conventional LED lamps functioning as push button light.

In this case, however, the light emission range 1a is narrow when there is only one LED lamp as shown in FIG. 3B. As a result, when the push button 6 is viewed from the front, only the center portion 6a of the push button 6 appears luminous as shown in FIG. 3C. Therefore, in practice, a large number of LED lamps 1 (15 in FIG. 4) are mounted to an LED matrix 7 as shown in FIG. 4. An optically-diffusing plate 8-1, a legend plate 8-2, and a push button plate 6 are sequentially mounted on the front of the LED matrix 7, and they are contained in a housing 8-3 to be used as an LED unit, that is, for example, a push button.

Figure 5:
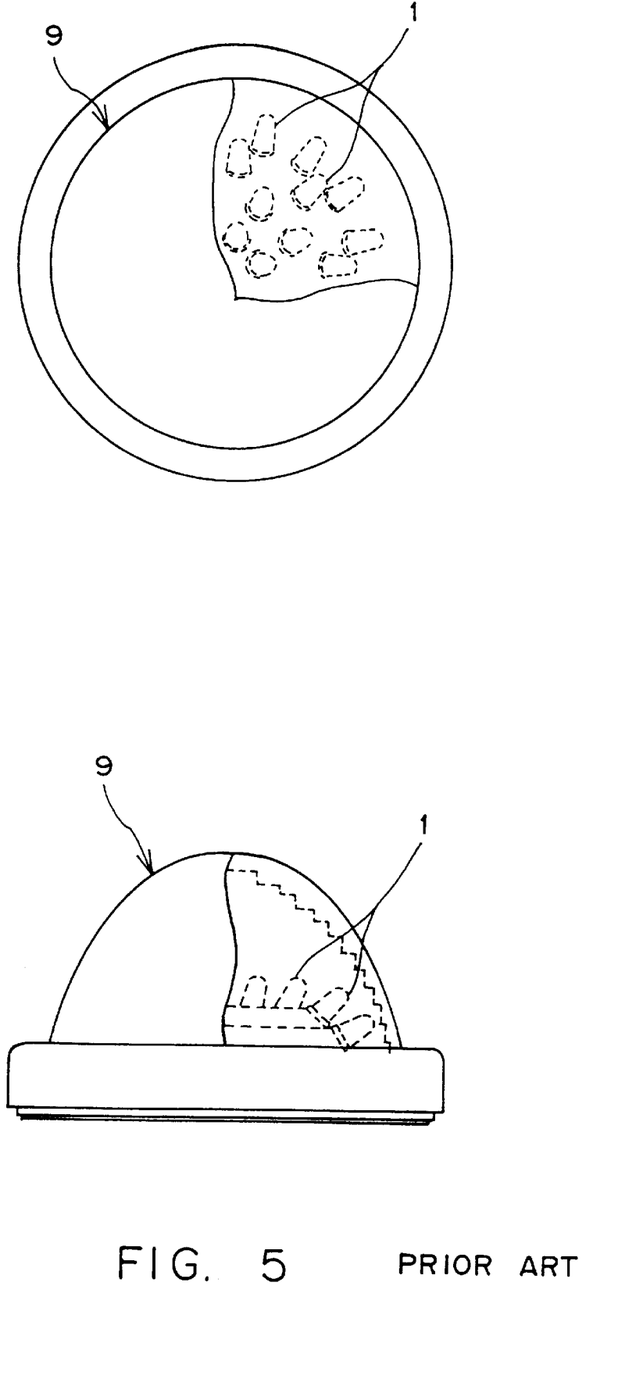
FIG. 5 shows the arrangement of the conventional LED lamps functioning as emergency light.

Assume that, as shown in FIG. 5, the LED lamp 1 is used for a light source 9 which hemispherical and needs to be recognized from many directions, such as a warning light on a fire hydrant provided at a subway station, a subway, etc., an emergency light at an emergency exit in an office building, a hotel, etc. A number of LED lamps 1 are mounted across the base and toward the flange of the light source 9, and should be arranged in such a way that the central axis of each of the LED lamps 1 is assigned at a progressively varied angle from the center toward the flange. With the thus-arranged LED lamps, the light can be emitted from the hemispherical light source 9 in all directions.

Thus, the LED lamp has been used for radially emitting light from a bulb-shaped portion.

However, since the above described filament lamps and cold-cathode tubes can be easily broken even when receiving only a small shock, because their bodies are made of thin glass bulb- or tube-shaped portions, they therefore require very careful handling and can give a lot of trouble to users. Furthermore, they are inconsistent in structure and luminous characteristics and have a relatively short operating life, thereby giving users the trouble of frequently replacing faulty bulb- and tube-shaped portions.

Furthermore, since such news boards require an enormous number of light emitting bulbs, the small filament lamps are not economical because each of the small filament lamps has a relatively high power consumption. On the other hand, the cold-cathode tube has the demerit in structure that it cannot form a small picture element of a screen like the small filament lamps.

The LED element also has the problem that it is limited in usage because it is directional in optical-emission as described above, although it is durable and consistent in emission characteristics. Furthermore, to obtain a light diffusing in all directions using the LED element, a great number of LED elements are required or an optically-diffusing board must be provided.

Additionally, a time table board at a station and a flight information board at an airport are also required to be seen from all directions, in order to allow the users to recognize the existence of the time table board or the flight information board from the side of the boards, even if they cannot correctly read the displayed characters, etc.

SUMMARY OF THE INVENTION

Under such conditions, the present invention aims at providing an LED lamp capable of emitting light in all directions except backward from the base of the LED lamp.

The above described LED lamp is etched on its surface into a frosted glass surface. It can also be processed with small particles of the same material as the LED lamp being applied onto the surface. Otherwise, the LED lamp can have an irregular cut-diamond-like surface. The surface of the LED lamp can also be covered with an optically-diffusing material. The base of the LED lamp can be designed to be removable from a socket. Thus, since the LED lamp is provided with a specific treatment on its surface, the light from the LED element is emitted in all directions, thereby realizing a small LED lamp for emitting light in all directions like a conventional small filament lamp. Furthermore, each LED lamp is non-fragile and durable, and has a low power consumption, thereby realizing an economical and easily-handled small LED lamp.

DESCRIPTION OF THE PREFERRED EMBODIMENTS

The embodiments of the present invention are described below by referring to the attached drawings.

Figure 6A:
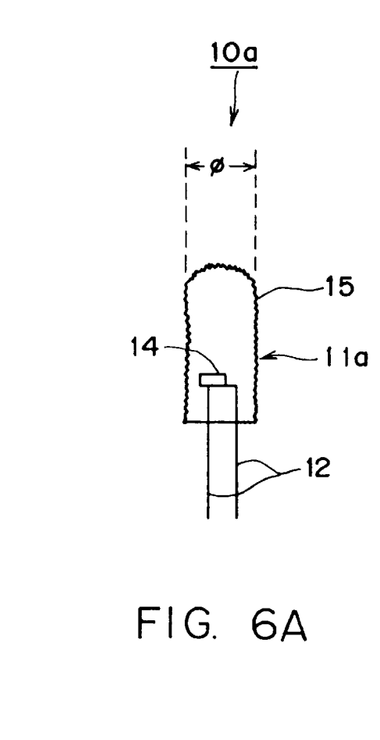
FIGS. 6A through 6D show the variations of the LED lamp in each embodiment of the present invention.
Figure 6B:
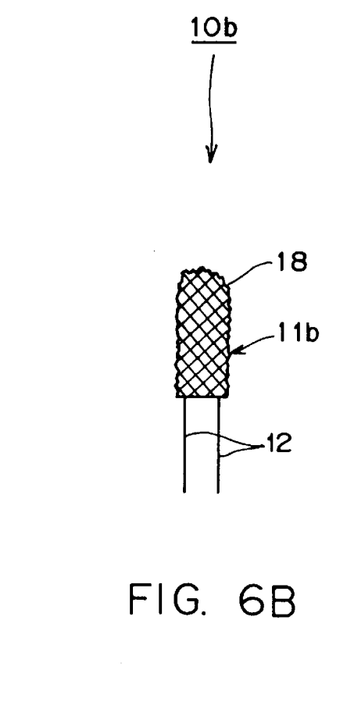
Figure 6C:
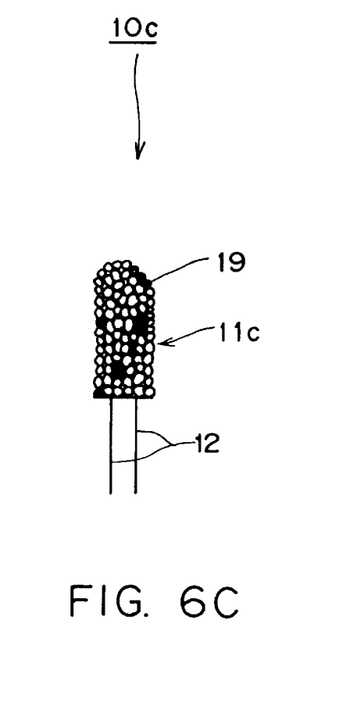
Figure 6D:
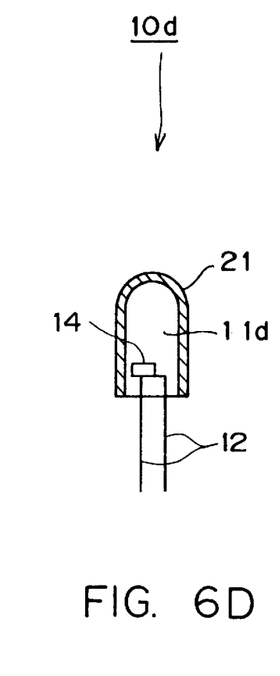

FIGS. 6A through 6D show the LED lamps according to the embodiment of the present invention. FIGS. 6A and 6D are side sectional views and FIGS. 6B and 6C are side views. An LED lamp 10 (10a, 10b, 10c, and 10d) shown in FIGS. 6A through 6D comprises, for example, an epoxy resin, or any other appropriate resin, or glass bulb-shaped portion 11 (11a, 11b, 11c, and 11d), two leads 12, one end of which is extended outside of the bulb-shaped portion 11 and the other end of which is embedded in the bulb-shaped portion, and an LED chip 14 connected to the ends of the two leads 12 embedded in the bulb-shaped portion 11 (the LED chip 14 is not shown in FIGS. 6B and 6C because they are side views only).

The LED chip 14 is provided with at least one LED element for emitting light of appropriate color. A lamp can be set using one or more LED elements. For example, an LED chip 14 emitting a requested color of light can be obtained by appropriately arranging a plurality of red, green, and blue LED elements. The diameter φ of the bulb-shaped portion is approximately 3 mm through 10 mm, though obviously, the diameter φ can be larger or smaller than these values. The surfaces of the bulb-shaped portions 11 (11a, 11b, 11c, and 11d) are processed with respective treatments.

First, the LED lamp 10a shown in FIG. 6A is etched or has formed on the surface of the bulb-shaped portion 11a a frosted glass surface 15. Thus, a part of the light emitted from the LED chip 14 is refracted at random and emitted outside, and the remaining part is reflected inside the bulb-shaped portion 11a at random at the interface between the surface of the frosted-glass-surface bulb-shaped portion 11a and air. A part of the light reflected inside is refracted at random again and emitted outside, and the remaining part is reflected inside at random. As a result, the light emitted from the LED lamp 10a is diffused and emitted in all directions except backward from the base of the bulb-shaped portion 11a.

Alternatively, the surface of the bulb-shaped portion 11b of the LED lamp 10b shown in FIG. 6B is etched or formed as an irregular cut-diamond surface 18. In this case, the light emitted from the LED chip 14 at a small emission angle is refracted at random at the interface between the cut-diamond surface 18 of the bulb-shaped portion 11b and air, and then emitted in all directions except backward from the base of the bulb-shaped portion 11b.

Further, the surface of the bulb-shaped portion 11c of the LED lamp 10c shown in FIG. 6c is covered with a very large number of small particles 19 of the same material as the bulb-shaped portion 11c, using a resin adhesive, etc. In this case, the light emitted from the LED chip 14 at a small emission angle is refracted at random at the interface between the irregular small particles 19 of the bulb-shaped portion 11c and air, and then emitted in all directions except backward from the base of the bulb-shaped portion 11c.

Still further, the surface of the bulb-shaped portion 11d of a normal LED lamp is covered with an optically-diffusing cap material 21 to form the LED lamp 10d shown in FIG. 6D. Any means of optical diffusion for the cap material 21 can be applicable. For example, it can be realized by any of the surface structures shown in FIGS. 6A, 6B, and 6C. The cap material 21 can be easily processed because it is used for covering a normal LED lamp. Also in this case, the light emitted from the LED chip 14 at a small emission angle is diffused by the optical diffusion of the cap material 21 covering the bulb-shaped portion 11d, and then the light is emitted in all directions except backward from the base of the bulb-shaped portion 11d.

Figure 7A:
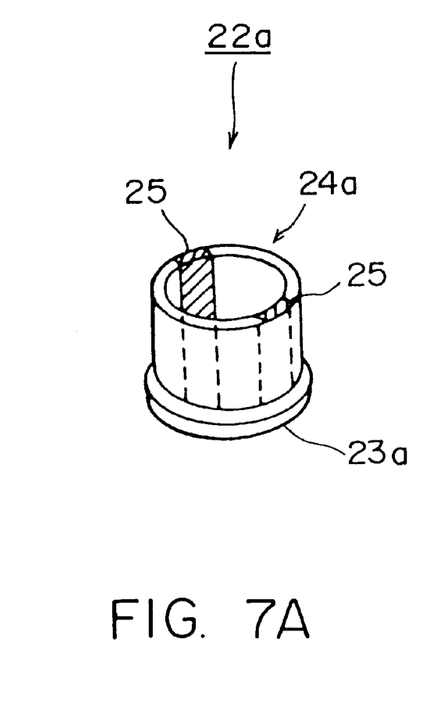
FIGS. 7A and 7B are oblique views of sockets for LED lamps in each embodiment of the present invention.
Figure 7B:
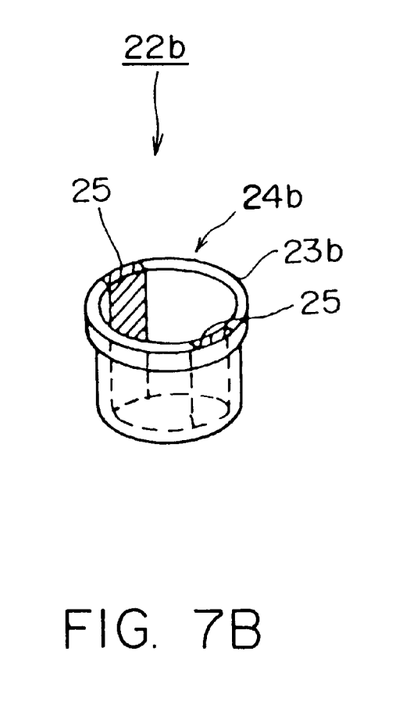

FIGS. 7A and 7B are oblique views of the socket for the LED lamp 10 designed as described above. The sockets shown in FIGS. 7A and 7B are designed as a pair with the fixture 26 shown in FIG. 7C. FIG. 7A shows the example in which a flange is provided at the bottom of a socket. FIG. 7B shows the example in which a flange is provided at the top of a socket.

Each of the circular sockets 22 (22a and 22b) comprises a flange 23 (23a and 23b) provided at the top or bottom of the socket 22, an insulating material 24 (24a and 24b) incorporated into the flange 23, and two opposing electrodes 25 set inside the insulating material 24 as shown in FIGS. 7A and 7B. The LED lamp 10 is inserted into the fixture 26, which makes a pair with either of the above described sockets 22a and 22b. The two leads 12 extended downward from the base of the inserted LED lamp 10 are bent upward along the outside of the fixture 26. In this state, the fixture 26 is inserted into either the socket 22a or 22b in such way that the two leads 12 respectively connect with the two electrodes 25. These electrodes 25 are connected to the power source through an appropriate conductor. Thus, the socket 22 can be fixed to the power source, and only the LED lamp 10 can be optionally removed from the power source or exchanged.

Figure 8A:
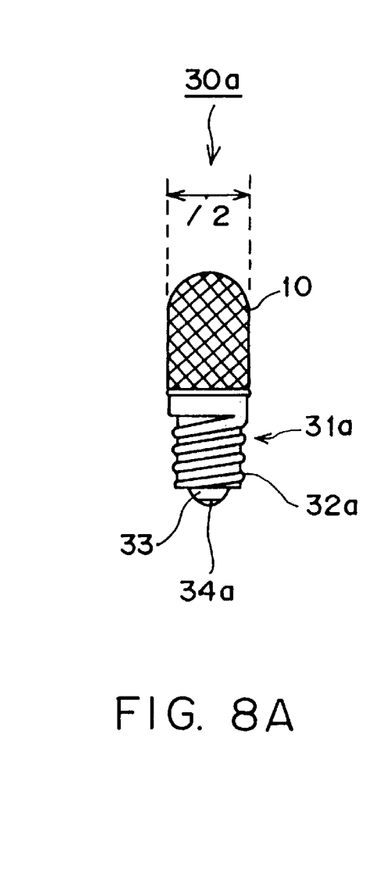
FIGS. 8A through 8C show examples of further embodiments of the present invention in which lamp bases are fixed to the LED lamps.
Figure 8B:
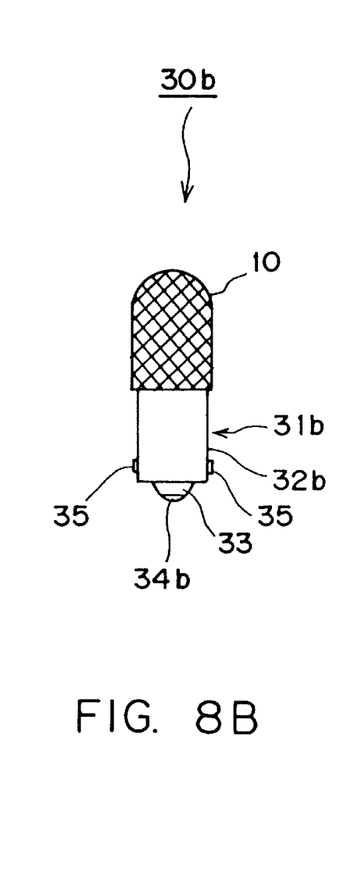
Figure 8C:
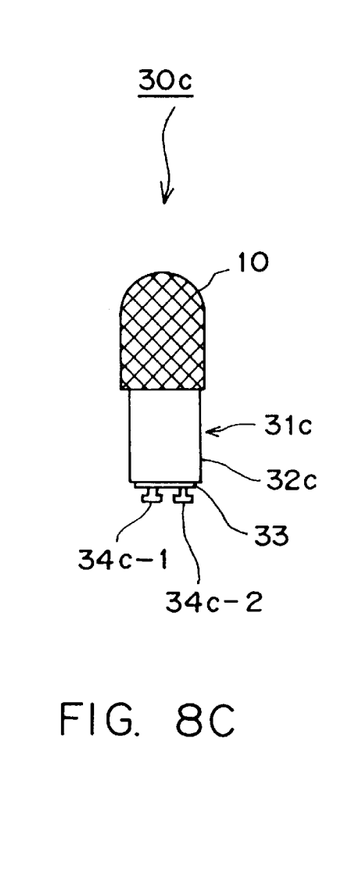
Figure 8D:
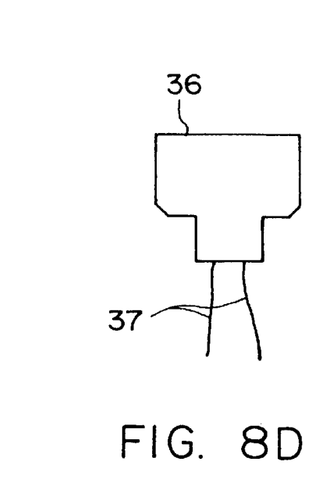
FIG. 8D shows an example of the socket.

FIGS. 8A through 8D show the configurations of further embodiments of the present invention. FIGS. 8A through 8C show three examples in each of which the lamp base for fixture for a socket is fixed to the base of the LED lamp 10 (a single LED lamp) shown in FIGS. 6A through 6D. FIG. 8D shows an example of the socket.

An LED lamp 30a shown in FIG. 8A is an example in which a normal screw lamp base 31a is fixed to the single LED lamp 10 shown in FIG. 6. The lamp base of this type is used for the most kinds of lamps. With a filament lamp, the cathode and anode of the terminals can be optionally determined. Normally, the metal of a peripheral part 32a of the lamp base 31a is defined as a cathode (terminal) and a terminal 34a projecting from the center of an insulating material 33 is defined as an anode (terminal). In the case of the LED lamp 30a shown in FIG. 8A, the leads 12 of the LED lamp 10 shown in FIG. 6 are connected by soldering from the inside to the metal of the peripheral part 32a of the lamp base 31a and the terminal 34a projecting downward, according to a predetermined polarity.

The LED lamp 30b shown in FIG. 8B is an example of a bayonet pin type lamp base of an LED lamp, which is removable from a socket by pushing and turning the LED lamp. This type of lamp base 31b is often used in Japan, for an old type of portable lighting device and also for flash lamp bulb, in which oxygen and magnesium foil are contained, for a domestic small printing device. With the lamp base 31b of this type, the peripheral part 32b is normally a cathode terminal, and the terminal 34b projecting from the center of the insulating material 33 at the bottom of the lamp base 31b is an anode. The lamp base 31b is attached to a socket by being inserted into the socket and turned therein, with the two pins 35 provided on the peripheral part 32b locating into slots in the inside of the socket. The peripheral part 32b corresponds to the peripheral part 32a, and the terminal 34b corresponds to the terminal 34a shown in FIG. 8A. Thus, the lamp base can be easily removed from the socket, thereby requiring only a short time in changing for a new LED lamp.

The lamp base 31c shown in FIG. 8c is often used with fluorescent or neon lamps as a starter, and the peripheral part 32c of the lamp base 31c is often used to form a shield surrounding such a lamp. However, in the case of an LED, it is not necessary to form a shield and therefore the peripheral part 32c is not required to be a conductor. That is, the base can be made of a synthetic resin, ceramic, etc. Terminals 34c-1 and 34c-2 projecting from the insulating material 33 also function as attachment bosses between the LED electrodes (anode and cathode) and the terminals in a socket.

Although FIG. 8D shows a single socket 36, the socket is different in inside structure (not shown in FIG. 8D) corresponding to each of the lamp bases 31a, 31b, and 31c shown in FIGS. 8A through 8C. From the bottom of the socket 36, two lead wires 37 correspond to the two electrodes of the lamp base 31a, 31b, or 31c to be inserted into the socket. These two lead wires 37 are connected to the power source through an appropriate conductor. Also in this case, the socket 36 is fixed to the power source, and only the LED lamp 30 (30a, 30b, and 30c) can be optionally removed from the power source or exchanged for a new LED lamp.

The diameter φ2 of a single LED lamp 10 forming part of the LED lamp 30 (30a, 30b, and 30c) provided with the above described lamp base is about 10 mm. However, it is obvious that the size (outer diameter) of the LED lamp 10 is not limited to 10 mm.

Figure 9A:
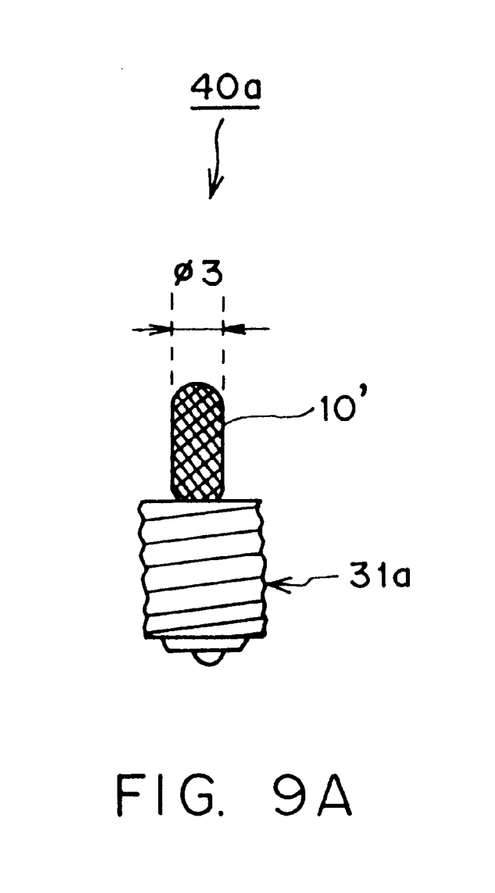
FIGS. 9A through 9C show examples of the lamp bases fixed to comparatively-small-diameter LED lamps.
Figure 9B:
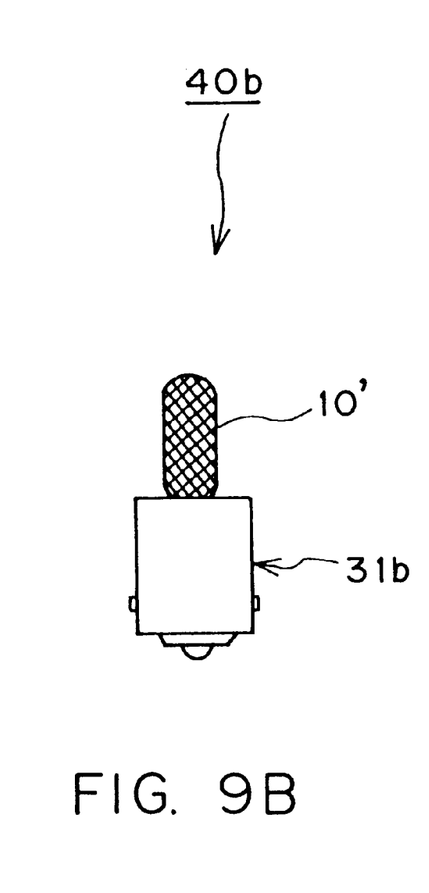
Figure 9C:
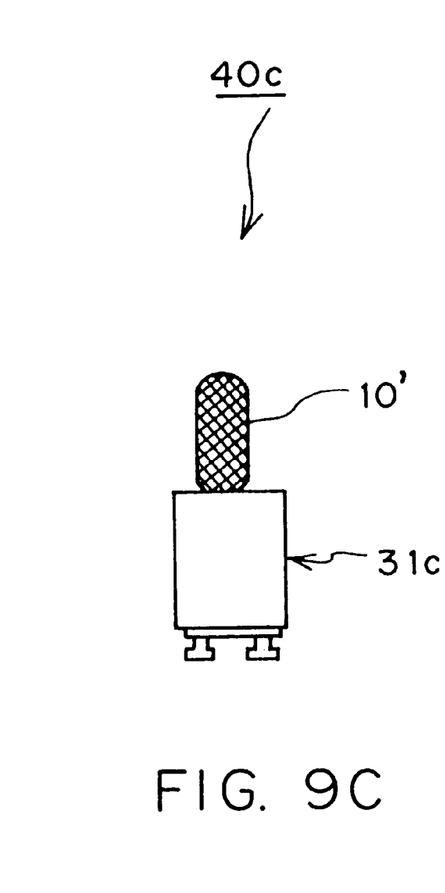

FIGS. 9A through 9C show examples in each of which a lamp base is fixed to a single LED lamp having a relatively small diameter. An LED lamp 40 (40a, 40b, and 40c) shown in FIGS. 9A through 9C is obtained by fixing the lamp base 31 (31a, 31b, and 31c) shown in FIGS. 8A, 8B, or 8C, to an LED lamp 10' having a relatively small diameter φ3 of about 3 mm through 5 mm (only the diameter is small, and the LED lamp is of the same configuration as the LED lamp 10 shown in FIGS. 6A through 6D). Thus, it is not necessary to form a single LED element of a predetermined size corresponding to a size of a lamp base formed according to a predetermined standard for a common socket. That is, an LED element of a desired size can be used.

Figure 10A:
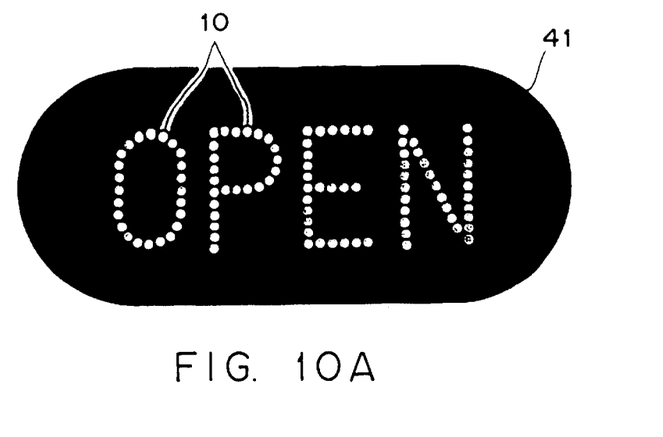
FIGS. 10A through 10C show examples of the LED lamps for information boards displaying characters according to the present invention.
Figure 10B:
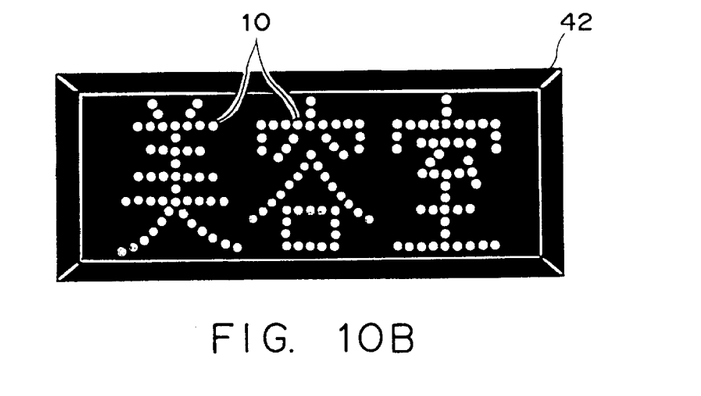
Figure 10C:
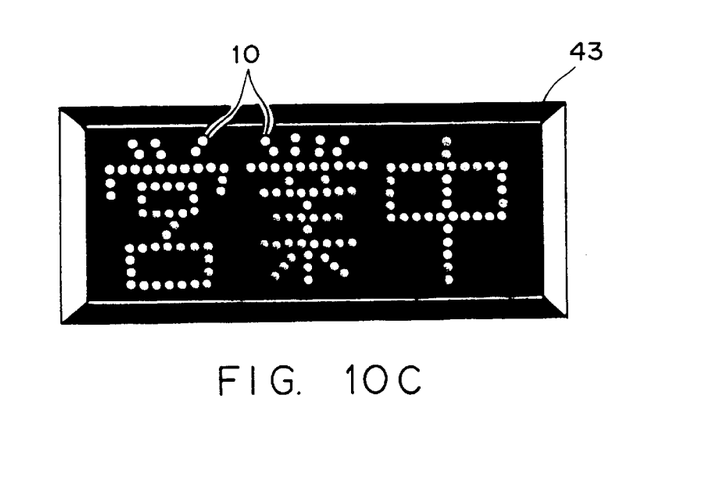

For information, examples of the uses of the above described LED lamps 10, 30, and 40 are described below. FIGS. 10A through 10C show uses of the LED lamps 10 (30 or 40). FIG. 10A shows the characters OPEN formed by arranging a number of LED lamps 10 on a signboard 41. The characters displayed on the signboard 41 can be recognized from the side as well as the front.

Figure 7C:
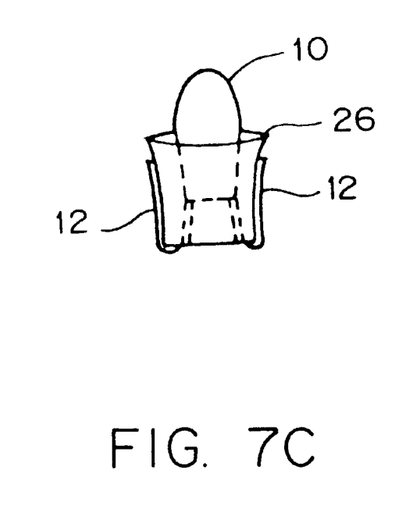
FIG. 7C shows the fixture for the sockets.

When the single LED lamp 10 shown in FIG. 10 is received as it is, the leads 12 of the LED lamp 10 are directly soldered to the wiring of the signboard 41. When the socket 22a shown in FIG. 7A is used, the socket 22a is inserted from the back of the holes provided for a socket in the surface of the signboard 41 and fixed, and the fixture 26 in which the LED lamp 10 is inserted as shown in FIG. 7C is attached from the front surface of the signboard 41 into the socket 22a. When the socket 22b shown in FIG. 7B is used, the socket 22b is inserted from the front of the holes provided for a socket in the surface of the signboard 41 and fixed, and the fixture 26 to which the LED lamp 10 is inserted as indicated above is attached from the front surface of the signboard 41 to the socket 22b.

With the LED lamp 30 with a lamp base as shown in FIGS. 8A through 8C or the LED lamp 40 with a lamp base as shown in FIGS. 9A through 9C, the socket 36 shown in FIG. 8D is fixed to the surface of the signboard 41, and the LED lamp 30 or 40 is inserted into the socket 36.

In any of the above described cases, the surface of the signboard 41 is covered with glass, etc. to protect the LED lamp from dirt, damage, etc. The display ('beauty parlor' in Chinese characters) on the signboard 42 using the LED lamps 10 (30 or 40) shown in FIG. 10B is formed as described above, and the display ('open' in Chinese characters) on the signboard 43 using the LED lamps 10 (30 or 40) shown in FIG. 10C is also formed as described above.

Figure 11:
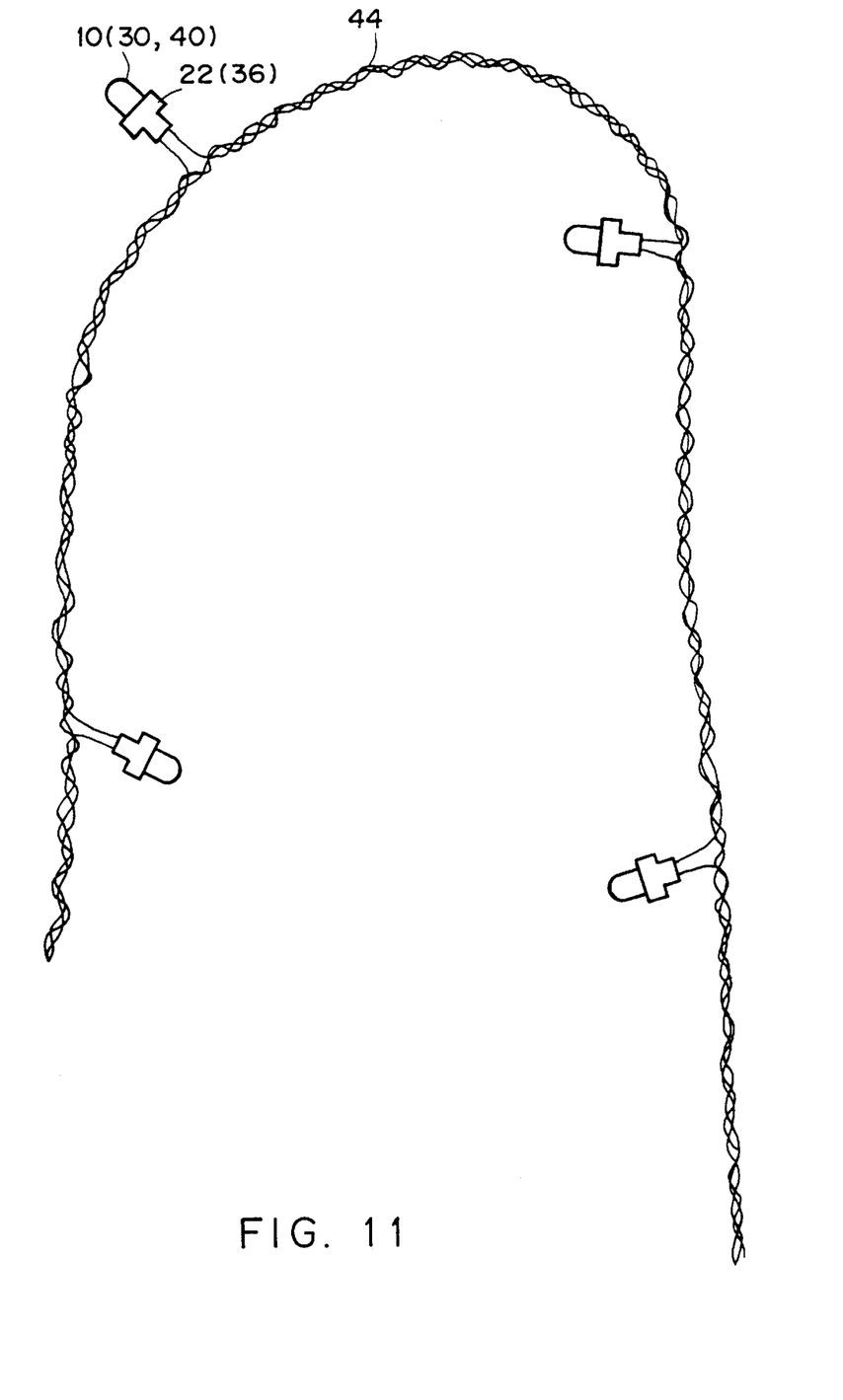
FIG. 11 shows an example of the LED lamp for a long light emitting device according to the present invention.

FIG. 11 shows another usage of the LED lamp 10 (30 or 40). FIG. 11 shows a long light emitting display apparatus used for illumination on a Christmas tree, etc. The long light emitting display apparatus is formed by connecting an appropriate number of LED lamps 10 arranged at predetermined intervals to a long insulated conductor 44. The LED lamp 10 is connected by directly connecting the leads 12 to the insulated conductor 44, or connected through the socket 22 (refer to FIGS. 7A and 7B) as shown in FIG. 11. When the LED lamp 30 or 40 is used, it is connected through the socket 36 (FIG. 8D).

The LED lamp 10 (30, or 40) emits light forward, sideward and obliquely backward as in the case of a filament lamp, and can emit light of different colors by using different LED elements in the bulb-shaped portion, thereby being suitable for the above described illuminations on Christmas trees, etc.

Figure 12A:
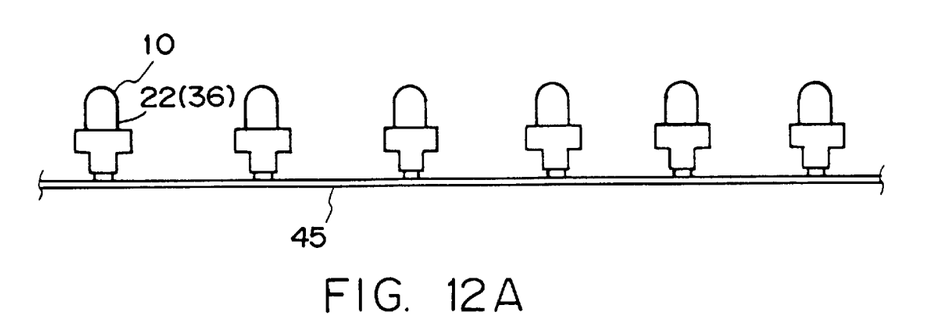
FIGS. 12A and 12B show examples of the LED lamps as a tape-shaped light emitting apparatus according to the present invention.
Figure 12B:
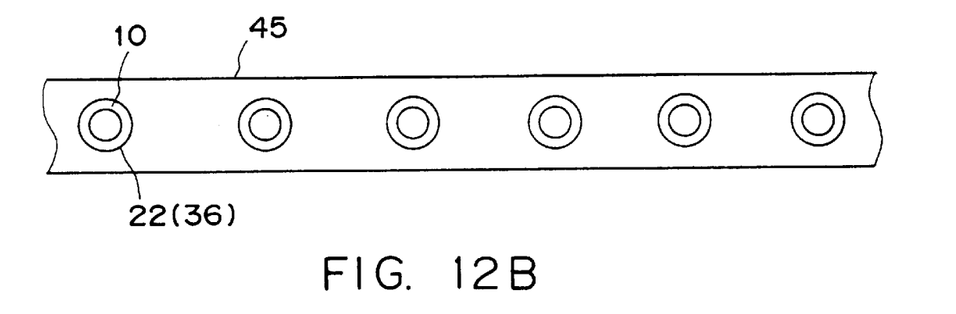

FIGS. 12A through 12B show examples of the LED lamps 10 (30, or 40) used on a tape as another usage of the LED lamps. FIG. 12A is a side view, and FIG. 12B is a top view. This light emitting apparatus is designed to have conductors (not shown in FIGS. 12A or 12B.) embedded in a flexible tape material 45. The LED lamps 10 arranged at appropriate intervals are connected directly to the conductors or through the socket 22 (the socket 36 for the LED lamp 30 or 40). This light emitting display apparatus can be formed into an optional arrangement by the flexible tape material. For example, the LED lamps 10 are arranged as surrounding the circumference of an exit such as an emergency exit of an aircraft, a department store, etc., and the LED lamps 10 can be lit in an emergency. Since the light from the LED lamps 10 can be seen from the side, the LED lamp is ideal for such as an emergency light. In the case of an indicator of an emergency exit, etc., a single LED lamp 10 can be used as shown in FIGS. 10A, 10B, and 10C.

An LED lamp is used without a flange according to each of the above described embodiments, but it can be provided with a flange. In this case, the LED lamp is attached to the fixture 26 shown in FIG. 7C from the rear. Furthermore, the LED lamp can also be used as a single LED lamp 10 or 10' of the LED lamp 30 or 40 with a lamp base shown in FIGS. 8A through 8C, and FIGS. 9A through 9D.

The uses of the LED lamps are not limited to those shown in FIGS. 10 through 13. If it is applied to such as a car width confirmation light (not shown in the drawings), light can be emitted in all directions with a low electric power consumption, thereby realizing a high-recognition economical light. Similarly, the LED lamps can be effectively used as back lights of various indicator panels facing a driver's seat. Some game machines are designed to indicate their current status when a member of staff of a game shop glances at them. If the LED lamps 10 (30 or 40) of the present invention are used as ornamental lights for these game machines, then the lights can be easily seen by the staff of the shop even from the end of an aisle in the shop.

The LED lamps 10 can be used as an ornamental display on the ceiling or wall of a room. As a signboard, a tight arrangement of the LED lamps can successfully function as neon lamps on the street. Although a single lamp can emit light of only one color, the colors of the tightly arranged LED lamps can be assigned at appropriate intervals so that patterns and pictorial characters can be represented that are more beautiful than the neon lights.

Figure 13A:
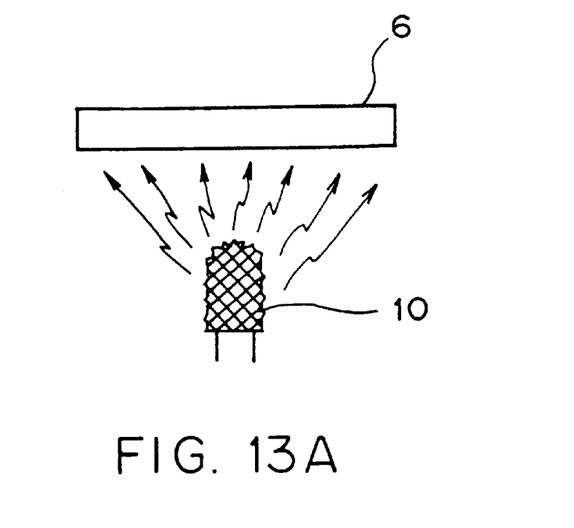
FIGS. 13A and 13B show examples of the LED lamps functioning as push button light according to the present invention.
Figure 13B:
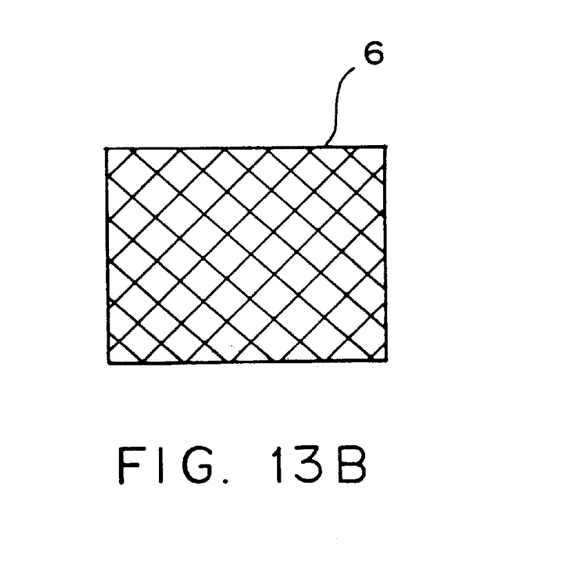

As a display, the LED lamp 10 (30 or 40) arranged on the LED matrix 7 as shown in FIG. 4 allows the light to be emitted at a wide angle, thereby the number of LED's arranged can be reduced to ½ or ⅓ of the current values. Furthermore, as shown in FIG. 13A, a single LED lamp 10 (30 or 40) can be arranged. As shown in FIG. 13B, the light appears as if it were diffused over the whole surface of the push button 6. Therefore, the arrangement of the optically-diffusing plate 8-1, shown in FIG. 4 is not required.

Furthermore, when the LED lamp 10 is used as a warning lamp for a fire hydrant, it is not necessary to consider the axial arrangement of each LED lamp, but a plurality of LED lamps 10 (30 or 40) can be appropriately arranged.

As described above, the LED lamp 10 (30 or 40) can be optionally fixed or plugged into various display devices, and is not limited in use.

What is claimed is:

1. A light-emitting-diode lamp comprising:

a resin body having a generally cylindrical form, with a convex hemispherical top, and an external surface formed as a frosted surface, and a base portion opposite the top; and a light source in the base portion of said resin body, wherein:

said light source comprises a light-emitting-diode chip directed to emit light mainly towards said hemispherical top; and said external frosted surface of said resin body is adapted so that uniformly diffused light is emitted by the lamp in all directions except backward through said base.

* * * * *